(12) United States Patent
Mohanty et al.

(10) Patent No.: US 8,044,737 B2
(45) Date of Patent: *Oct. 25, 2011

(54) TIMING OSCILLATORS AND RELATED METHODS

(75) Inventors: Pritiraj Mohanty, Los Angeles, CA (US); Klaus Juergen Schoepf, Ringwood, NJ (US); Alexei Gaidarzhy, Boston, MA (US); Guiti Zolfagharkhani, Boston, MA (US); David M. Chen, Brookline, MA (US); Matthew J. Crowley, Milton, MA (US)

(73) Assignee: Sand9, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/111,544

(22) Filed: Apr. 29, 2008

(65) Prior Publication Data

US 2009/0267699 A1 Oct. 29, 2009

(51) Int. Cl.
*H03B 5/30* (2006.01)

(52) U.S. Cl. .................. 331/156; 331/154; 331/116 M; 331/177 R

(58) Field of Classification Search .............. 331/68, 331/116 R, 116 M, 154, 156, 158
See application file for complete search history.

(56) References Cited

U.S. PATENT DOCUMENTS

| 5,327,104 | A | * | 7/1994 | Kikushima | ...................... | 331/68 |
|---|---|---|---|---|---|---|
| 5,455,547 | A | | 10/1995 | Lin et al. | | |
| 5,473,289 | A | | 12/1995 | Ishizaki et al. | | |
| 5,491,604 | A | | 2/1996 | Lin et al. | | |
| 5,537,083 | A | | 7/1996 | Lin et al. | | |
| 5,589,082 | A | | 12/1996 | Lin et al. | | |
| 5,640,133 | A | | 6/1997 | MacDonald et al. | | |
| 5,644,271 | A | | 7/1997 | Molloy et al. | | |
| 5,839,062 | A | | 11/1998 | Nguyen et al. | | |
| 5,883,550 | A | | 3/1999 | Watanabe et al. | | |
| 5,914,553 | A | | 6/1999 | Adams et al. | | |
| 5,959,516 | A | | 9/1999 | Chang et al. | | |
| 6,124,765 | A | | 9/2000 | Chan et al. | | |
| 6,249,073 | B1 | | 6/2001 | Nguyen et al. | | |
| 6,424,074 | B2 | * | 7/2002 | Nguyen | ........................ | 310/309 |
| 6,557,419 | B1 | | 5/2003 | Herb et al. | | |
| 6,577,040 | B2 | | 6/2003 | Nguyen | | |

(Continued)

FOREIGN PATENT DOCUMENTS

WO    WO 98/01948 A1    1/1998

(Continued)

OTHER PUBLICATIONS

Gaidarzhy, A., "Spectral response of a gigahertz-range nanomechanical oscillator," *App. Phys. Lett.* 86, 254103-1, 2005 American Inst. of Physics.

(Continued)

*Primary Examiner* — Ryan Johnson
(74) *Attorney, Agent, or Firm* — Wolf, Greenfield & Sacks, P.C.

(57) ABSTRACT

Timing oscillators as well as related methods and devices are described. A timing oscillator may include a mechanical resonating structure with major elements and minor elements coupled to the major element. The timing oscillator can generate stable signals with low phase noise at very high frequencies which allows a timing oscillator to be used effectively in a number of devices including computers and mobile phones for time and data synchronization purposes. The signal generated by the timing oscillator can be tuned using a driver circuit and a compensation circuit.

18 Claims, 6 Drawing Sheets

U.S. PATENT DOCUMENTS

| | | | |
|---|---|---|---|
| 6,593,831 B2 | 7/2003 | Nguyen | |
| 6,600,252 B2 | 7/2003 | Nguyen | |
| 6,667,558 B2 | 12/2003 | Wong et al. | |
| 6,680,660 B2 | 1/2004 | Nguyen | |
| 6,710,680 B2 | 3/2004 | Niu et al. | |
| 6,713,938 B2 | 3/2004 | Nguyen | |
| 6,734,762 B2 | 5/2004 | Cornett et al. | |
| 6,739,190 B2 | 5/2004 | Hsu et al. | |
| 6,828,713 B2 | 12/2004 | Bradley et al. | |
| 6,831,531 B1 | 12/2004 | Giousouf et al. | |
| 6,856,217 B1 | 2/2005 | Clark et al. | |
| 6,859,113 B2 | 2/2005 | Giousouf et al. | |
| 6,861,914 B2 | 3/2005 | Photiadis et al. | |
| 6,909,221 B2 | 6/2005 | Ayazi et al. | |
| 6,917,138 B2 | 7/2005 | Nguyen | |
| 6,930,569 B2 | 8/2005 | Hsu | |
| 6,943,484 B2 | 9/2005 | Clark et al. | |
| 6,954,020 B2 | 10/2005 | Ma et al. | |
| 6,987,432 B2 | 1/2006 | Lutz et al. | |
| 6,995,622 B2 * | 2/2006 | Partridge et al. | 331/66 |
| 7,005,946 B2 | 2/2006 | Duwel et al. | |
| 7,068,125 B2 | 6/2006 | Lutz et al. | |
| 7,098,753 B1 | 8/2006 | Dumitrescu et al. | |
| 7,102,467 B2 | 9/2006 | Lutz et al. | |
| 7,104,129 B2 | 9/2006 | Nasiri et al. | |
| 7,202,761 B2 | 4/2007 | Lutz et al. | |
| 7,211,926 B2 | 5/2007 | Quevy et al. | |
| 7,215,061 B2 | 5/2007 | Kihara et al. | |
| 7,247,246 B2 | 7/2007 | Nasiri et al. | |
| 7,248,128 B2 | 7/2007 | Mattila et al. | |
| 7,250,353 B2 | 7/2007 | Nasiri et al. | |
| 7,352,608 B2 | 4/2008 | Mohanty et al. | |
| 7,358,822 B2 * | 4/2008 | Aubin et al. | 331/116 M |
| 7,442,570 B2 | 10/2008 | Nasiri et al. | |
| 7,492,241 B2 | 2/2009 | Piazza et al. | |
| 7,504,909 B2 | 3/2009 | Tada | |
| 7,545,239 B2 * | 6/2009 | Hagelin et al. | 333/186 |
| 7,724,103 B2 | 5/2010 | Feng et al. | |
| 7,791,432 B2 | 9/2010 | Piazza et al. | |
| 7,808,332 B1 * | 10/2010 | Pedersen et al. | 331/155 |
| 2001/0006357 A1 | 7/2001 | Yamamoto | |
| 2005/0073078 A1 | 4/2005 | Lutz et al. | |
| 2007/0170440 A1 | 7/2007 | Partridge et al. | |
| 2007/0188254 A1 | 8/2007 | Sutardja | |
| 2007/0247245 A1 | 10/2007 | Hagelin | |
| 2007/0257728 A1 | 11/2007 | Boser et al. | |
| 2007/0257740 A1 | 11/2007 | Boser et al. | |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0026882 A1 | 1/2009 | Steeneken et al. | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0267700 A1 | 10/2009 | Mohanty et al. | |
| 2009/0294638 A1 | 12/2009 | Mohanty et al. | |
| 2010/0007443 A1 | 1/2010 | Mohanty et al. | |
| 2010/0134207 A1 | 6/2010 | Mohanty et al. | |
| 2010/0155883 A1 | 6/2010 | Wenzler et al. | |

FOREIGN PATENT DOCUMENTS

| | | |
|---|---|---|
| WO | WO 98/37635 A1 | 8/1998 |
| WO | WO 02/17481 A2 | 2/2002 |
| WO | WO 2005/029700 A1 | 3/2005 |
| WO | WO 2006/000611 A2 | 1/2006 |
| WO | WO 2006/083482 A2 | 8/2006 |
| WO | WO 2007/072408 A2 | 6/2007 |
| WO | WO 2007/072409 A2 | 6/2007 |
| WO | WO 2007/143520 A2 | 12/2007 |
| WO | WO 2008/118383 A1 | 10/2008 |
| WO | WO 2010/011288 A1 | 1/2010 |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion from International Application No. PCT/US2009/002612, mailed May 11, 2010.

International Search Report and International Preliminary Report on Patentability for PCT/US2006/021298 mailed Nov. 6, 2006 and Dec. 6, 2007 respectively.

International Search Report and Written Opinion from corresponding International Application No. PCT/US2007/079078, mailed Jul. 3, 2008.

International Search Report and Written Opinion from corresponding International Application No. PCT/US2008/003793, mailed Jun. 16, 2008.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

* cited by examiner

TIMING OSCILLATORS AND RELATED METHODS

FIELD OF INVENTION

The invention relates generally to timing oscillators as well as related methods and devices, and more particularly, to timing oscillators that include a mechanical resonating structure.

BACKGROUND OF INVENTION

The generation of high frequency signals has become extremely important due to the increasing use and application of wireless technology and high frequency devices such as personal digital assistants (PDAs) and mobile phones. Currently, several methods and devices can be used to generate high frequency signals. One example is an oscillator, which produces a signal that resonates or vibrates at a specific frequency. There are several types of oscillators. Oscillators can be mechanical, electrical, or a combination of the two, namely electromechanical, in nature. Electro-mechanical oscillators are commonly used because of their ability to generate a stable signal at a precise frequency. An electromechanical oscillator uses the vibrations of a mechanical element to create an electrical signal. Electro-mechanical oscillator signals are often used in applications involving timers due to the precise and stable nature of the generated signal. Electro-mechanical oscillators used in timing applications are often referred to as timing oscillators.

Timing oscillators can be used in several devices including digital clocks, radios, computers, oscilloscopes, signal generators, and cell phones. Timing oscillators generate a clock signal, for example, as a reference frequency to help synchronize other signals that are received, processed, or transmitted by a device. Often times, multiple processes are run simultaneously on a device and the execution of such processes rely on a clock signal that is generated by the timing oscillator. A designer's or user's ability to effectively manage and synchronize data at high speeds using timing oscillators makes electromechanical oscillators a valuable component of several hardware and software designs and devices.

An example of an electromechanical timing oscillator is a crystal oscillator. When an electric field is applied to a crystal, the crystal becomes distorted. Upon removal of the electric field, the crystal returns to its previous shape and generates an electric field and voltage. This phenomenon is known as piezoelectricity. Depending on the composition of the crystal, the signal produced by the crystal will have a certain resonant frequency. However, using a crystal oscillator for high frequency applications may have several disadvantages. The resonant frequency of the signal generated from a crystal oscillator is dependent on the size and shape of the crystal. Most crystal oscillators are useful for generating signals in the KHz to MHz range whereas most of the latest technology demands signals in the GHz range. Furthermore, the size of a crystal is significantly large occupying more space on a chip compared to other available components.

One solution to overcome the limitation of the generated frequencies of a timing oscillator is to use multipliers. The generated signal can be multiplied using a mixer or a number of other devices known to one of skill in the art to output a new signal at a much higher frequency. For example, a multiplier receiving a signal with a frequency of 50 MHz as an input, can output a final signal of 2 GHz by multiplying the input signal by a factor of 40. However, such an approach is problematic, since doubling a signal's frequency may result in increasing the phase noise, for example, by 6 dB. Hence converting a signal from the MHz range to the upper MHz range or GHz range will result in a significant corruption of the signal quality because of an increase in the phase noise. Conventional timing oscillators may thus not be ideal for generating high frequency signals.

SUMMARY OF INVENTION

Timing oscillators are described herein as well as related methods and devices.

According to one aspect, a timing oscillator comprises a mechanical resonating structure including a major element and a minor element coupled to the major element; a drive circuit designed to provide an input signal to the mechanical resonating structure; and a compensation circuit coupled to the mechanical resonating structure.

In another aspect, a timing oscillator comprises a mechanical resonating structure. The timing oscillator is designed to generate a first signal and provide an output signal such that a frequency of the first signal is equal to or greater than a frequency of the output signal.

According to another aspect, a device comprises a timing oscillator configured to generate a first signal and produce an output signal. The device further comprises a dividing circuit configured to receive the output signal from the timing oscillator. The dividing circuit is configured to produce a second output signal having a frequency greater than a frequency of the output signal from the timing oscillator.

According to another aspect, a method comprises: generating a first signal using a timing oscillator comprising a mechanical resonating structure; and processing the first signal to provide an output signal having a frequency equal to or less than the first signal.

According to another aspect, a timing oscillator comprises a bank of micromechanical resonating structures designed to provide multiple respective output signals. The micromechanical resonating structures include at least one resonating structure having a large dimension of less than 100 micron. At least one switch is associated with the bank of mechanical resonating structures. The at least one switch is designed to select a first signal from the output signals from the bank of micromechanical resonating structures.

In another aspect, a timing oscillator can be designed to produce an output signal. The timing oscillator can have at least one mechanical resonating structure and a total height of the timing oscillator can be less than 0.5 mm.

In another aspect, a packaged integrated circuit comprises a timing oscillator designed to produce at least one output signal where the timing oscillator has a mechanical resonating structure, a device associated with the timing oscillator, and a package surrounding, at least in part, the timing oscillator and the device.

In another aspect, an integrated circuit comprises a timing oscillator designed to produce an output signal and a device associated with the timing oscillator. The timing oscillator and the device are integrated on the same package and the timing oscillator has at least one mechanical resonating structure.

In another aspect, a timing oscillator comprises a mechanical resonating structure formed on a first substrate and a circuit formed on a second substrate. The circuit is electrically connected to the mechanical resonating structure.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Timing oscillators are described herein as well as related methods and devices. The timing oscillators may include a mechanical resonating structure. A drive circuit may provide an input signal to the mechanical resonating structure causing it to vibrate. In some embodiments, the mechanical resonating structure comprises more than one element coupled to one another. For example, the resonating structure may include a major element having a micron-scale dimension coupled to one or more minor elements having a nano-scale dimension. In some cases, a compensation circuit is built into the timing oscillator to adjust, or modify, the timing oscillator output signal. The compensation circuit can provide the required adjustments that arise due to several reasons including operational and manufacturing glitches. The timing oscillators may be useful for applications that require generating high frequency signals with low noise and a high Q-factor (quality factor).

Figure 1A:
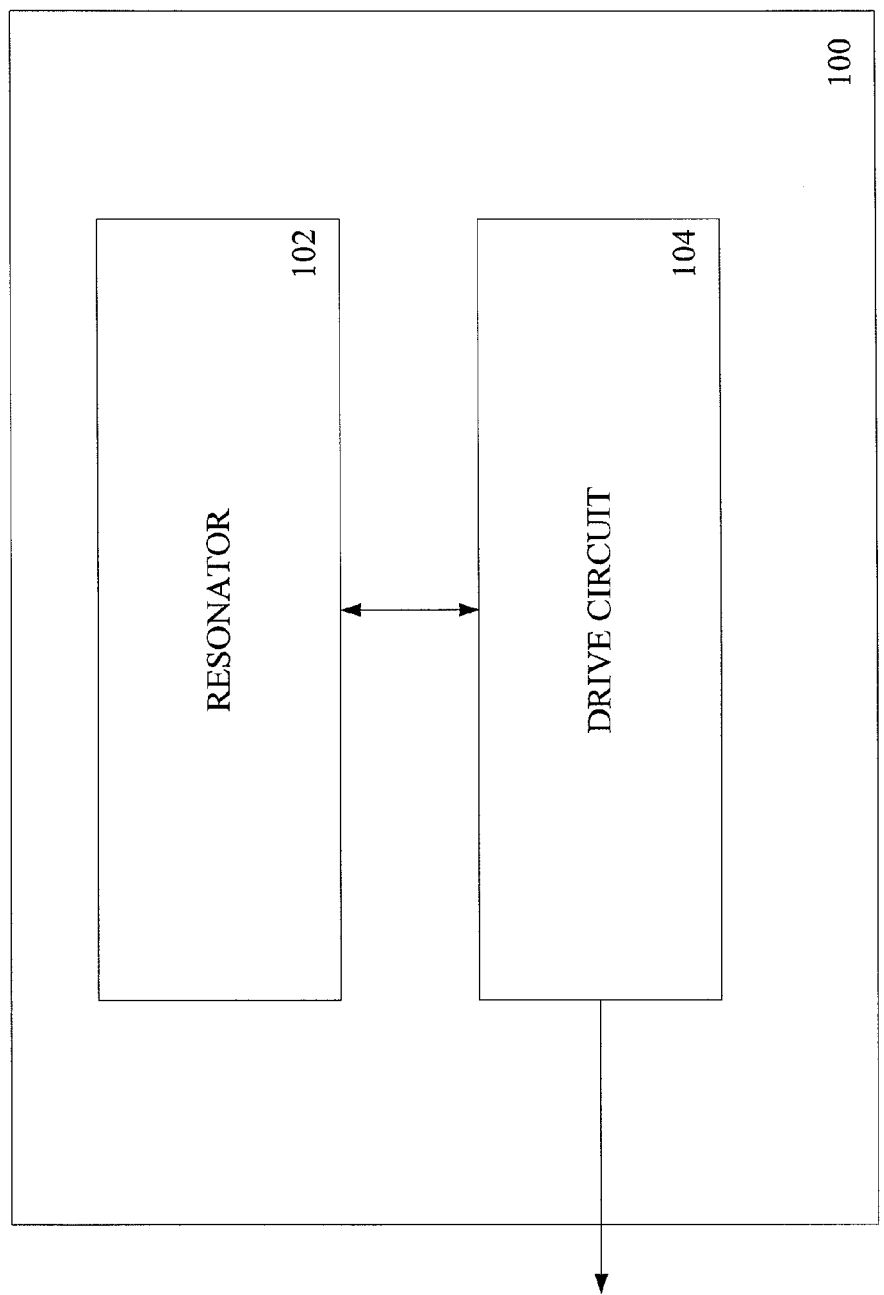
FIG. 1A shows a timing oscillator with a resonator and a drive circuit according to an embodiment of the present invention.

FIG. 1A illustrates a timing oscillator 100 according to one embodiment of the invention. In this embodiment, the timing oscillator includes a resonator 102 and a drive circuit 104.

Figure 2:
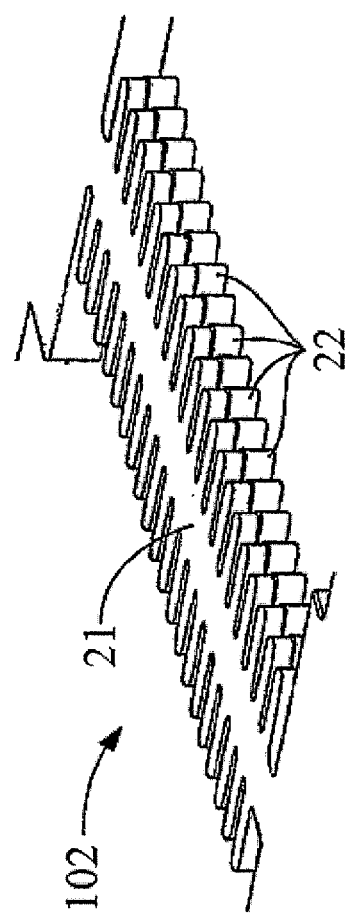
FIG. 2 shows a mechanical resonating structure with major and minor elements according to an embodiment of the present invention.

The resonator 102 in FIG. 1A is a mechanical resonating structure (also known as a mechanical resonator) which is a passive device that produces a signal at a desired frequency using mechanical elements as shall be described in more detail in FIG. 2. The mechanical resonator can be tuned to adjust the output frequency. For example, the resonator may be tuned by selecting design parameters such as geometry, dimensions and material type. In general, a variety of different resonator designs may be used. As described further below in connection with FIG. 2, in some embodiments, the mechanical resonator may include a major element coupled to one or more minor elements.

A resonator can produce self-sustained oscillations by being connected to a drive circuit with active electronic circuits. The drive circuit can have a feedback loop (see, for example, 112 in FIG. 1B) that contains resistive and capacitive elements (see, for example, 114 and 116, respectively, in FIG. 1B). The resistive and capacitive elements can be tuned to generate a desired oscillator output signal. In one embodiment of the invention, the drive circuit contains an operational amplifier with a large gain resistor in a feedback loop. In general, any suitable drive circuit may be used.

Figure 1B:
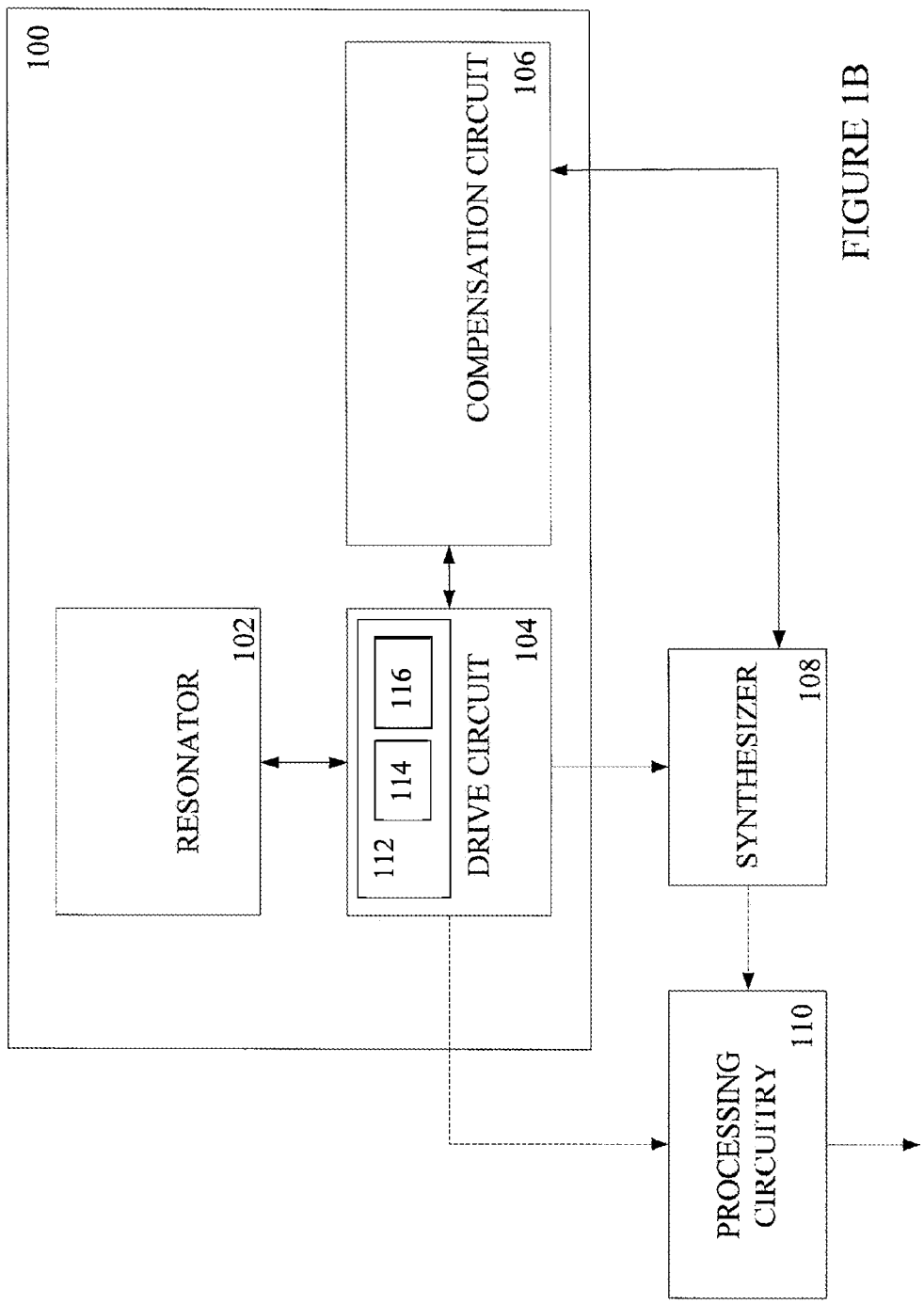
FIG. 1B shows a timing oscillator with a resonator, a compensation circuit, and a drive circuit according to an embodiment of the present invention.

A compensation circuit 106 can be integrated into the drive circuit or designed as a supplement to the drive circuit as shown in FIG. 1B. In general, the compensation circuit may have a number of different configurations which may be suitable. The compensation circuit may include multiple circuits and compartments where each compartment is designed to perform a desired compensation function.

The compensation circuit can be used to perform modifications to improve or rectify the timing oscillator's output signal. Inaccuracies in manufacturing chips and packages often result in process variations or malfunctioning components which can lead to undesirable output signals. The compensation circuit can provide the means to rectify errors including but not limited to process variations, thermal variations, and jitter.

Jitter occurs when a signal has excess phase that varies with time resulting in the generation of an inconsistent signal. Jitter can be random in nature and is a common phenomenon observed in electronic devices and communication signals. Reducing jitter decreases the phase noise of a signal. Compensation circuit 106 may be designed to control and limit jitter.

Internal thermal variations can arise as a result of fluctuations in the voltage or current levels in a device and can give rise to random motion of charge carriers, typically electrons, across semiconductor materials. Similar to jitter, the random motion of electrons generates thermal noise in circuits which deteriorates the quality of the output signal due to increased phase noise.

In addition to internal thermal variations, external or ambient temperature changes can affect the functionality of a device. Materials within a device can expand or contract by varying amounts depending on the temperature in which the device is operating in. The expansion and contraction of a device's material can significantly impair the performance of a device, particularly its operating frequency. The amount of expansion and contraction in a material can be determined using the material's thermal expansion coefficients.

The compensation circuit 106 can be designed to rectify errors due to internal and external thermal variations. The compensation circuit can contain a calibration table which stores information related to the operational frequency as a function of temperature. Thus, as the internal or external temperature varies, the compensation circuit can refer to the calibration table and adjust the tunable components of the timing oscillator to produce the desired signal output.

In addition to thermal variations, several glitches may arise in the process of fabricating devices particularly, as device dimensions get smaller. For example, at such dimensions, such errors in fabricating chips and devices (also known as process variations) can begin to have more pronounced effects on the performance of a device including effecting the output signal. The compensation circuit can be programmed to take into account errors due to process variations. The programming may take place while testing the timing oscillator or before operating the timing oscillator.

Jitter, thermal variations, and process variations are discussed by way of example. It should be understood that the compensation circuit is not limited to adjusting the timing oscillator output only due to jitter, thermal variations, and process variations. The compensation circuit can modify the timing oscillator output to take into account other various sources of error (e.g., stress) in the output of the mechanical resonator.

In one embodiment of the invention, as shown in FIG. 1B, a synthesizer 108 is coupled to the compensation circuit 106. However, it should be understood that not all embodiments include a synthesizer. The synthesizer can be external of the timing oscillator or integrated into the drive circuit 104. A Phase-Locked Loop (PLL) is an example of a synthesizer that can control the phase of a signal, which in one embodiment of this invention, is the signal generated from the mechanical resonator 102. A PLL can be used to control signals at a large range of frequencies including frequencies as low as the KHz to as high as the GHz.

The synthesizer 108 may comprise a filter, oscillator, or other signal processing devices well known to one of skill in the art. For example, in a timing oscillator, the synthesizer can include a phase detector to minimize the difference between a signal generated by a drive circuit and a signal generated by a voltage-controlled oscillator (VCO). This process is repeated until the VCO's output signal has a phase that matches the drive circuit's phase.

It should be understood that the synthesizer is not limited to the components listed above. For example, a synthesizer may not include all the components listed above and/or may include other circuit elements, such as a charge pump, to achieve the desired performance.

According to one embodiment of the invention, the output of the timing oscillator is coupled to a processing circuit 110. The processing circuit 110 can include any type of circuit or device to process the signal generated by the timing oscillator 100. For example, the processing circuit 110 may include filters, mixers, dividers, amplifiers, or other application specific components and devices. A generated signal can be transmitted to other devices using a transmitter built into the processing circuitry 110. The output of the timing oscillator 100 may be connected directly to the processing circuit 110 or via the synthesizer 108. Configurations and connections between the processing circuitry 110, synthesizer 108, and timing oscillator 100 may vary depending on the type of application and generated signal desired.

As mentioned above, the mechanical resonator 102 can generate a signal at a desired frequency using one or more mechanical elements. FIG. 2 shows a mechanical resonator 102 including one suitable arrangement of mechanical elements according to some embodiments of the invention. The mechanical resonator includes multiple minor elements 22 coupled to a major element 21. In this embodiment, the minor elements 22 are in the form of cantilever beams and the major element 21 is in the form of a doubly-clamped beam which extends between two supports. An input signal, supplied by the drive circuit, may be applied using a suitable excitation source which vibrates minor elements at a high frequency. As described further below, vibration of the minor elements 22 influences the major element 21 to vibrate at a high frequency but with a larger amplitude than that of the individual minor elements. The mechanical vibration of the major element 21 may be converted to an electrical output signal which, for example, may be processed by the compensation circuit 106 or synthesizer 108.

It should be understood that other suitable designs of the mechanical resonator may be used including designs with different arrangements of major and minor elements. Suitable mechanical resonators have been described, for example, in International Publication No. WO 2006/083482 and in U.S. patent application Ser. No. 12/028,327, filed Feb. 8, 2008, which are both incorporated herein by reference in their entireties.

In some embodiments, the minor elements 22 have dimensions in the nanoscale and are thus capable of vibrating at fast speeds producing resonant frequencies at significantly high frequencies (e.g., 1-10 GHz). The major element 21 coupled to the minor elements 22 then begins to vibrate at a frequency similar to the resonant frequency of the minor elements 22. Each minor element contributes vibrational energy to the major element 21 which enables the major element 21 to vibrate at a higher amplitude than possible with only a single nanoscale element. The vibration of the major element 21 can produce an electrical signal, for example, in the gigahertz range (or higher) with sufficient strength to be detected, transmitted, and/or further processed enabling the devices to be used in many desirable applications including wireless communications.

In general, the minor elements 22 have at least one smaller dimension (e.g., length, thickness, width) than the major element 21. In the illustrative embodiment, the minor elements 22 have a shorter length than the major element 21. The minor elements 22 may have nanoscale (i.e., less than 1 micron) dimensions. In some embodiments, at least one of the dimensions is less than 1 micron; and, in some embodiments, the "large dimension" (i.e., the largest of the dimensions) is less than 1 micron. For example, minor elements 22 may have a thickness and/or width of less than 1 micron (e.g., between 1 nm and 1 micron). Minor elements 22 may have a large dimension (e.g., length) between about 0.1 micron and 10 micron; or, between 0.1 micron and 1 micron. Major element 21 can have a width and/or thickness of less than 10 micron (e.g., between 10 nm and 10 micron). Major element 21 may have a length of greater than 1 micron (e.g., between 1 micron and 100 micron); in some cases, the major element 21 has a length of greater than 10 micron (e.g., between 10 micron and 100 micron). In some cases, the major element has a large dimension (e.g., length) of less than 100 micron.

The dimensions of the major 21 and minor 22 elements are selected, in part, based on the desired performance including the desired frequency range of input and/or output signals associated with the device. It should be understood that dimensions outside the above-noted ranges may also be suitable. Suitable dimensions have also been described in International Publication No. WO 2006/083482 which is incorporated herein by reference above. It should also be understood that the major 21 and/or minor 22 elements may have any suitable shape and that the devices are not limited to beam-shaped elements. Other suitable shapes have been described in International Publication No. WO 2006/083482.

Figure 3:
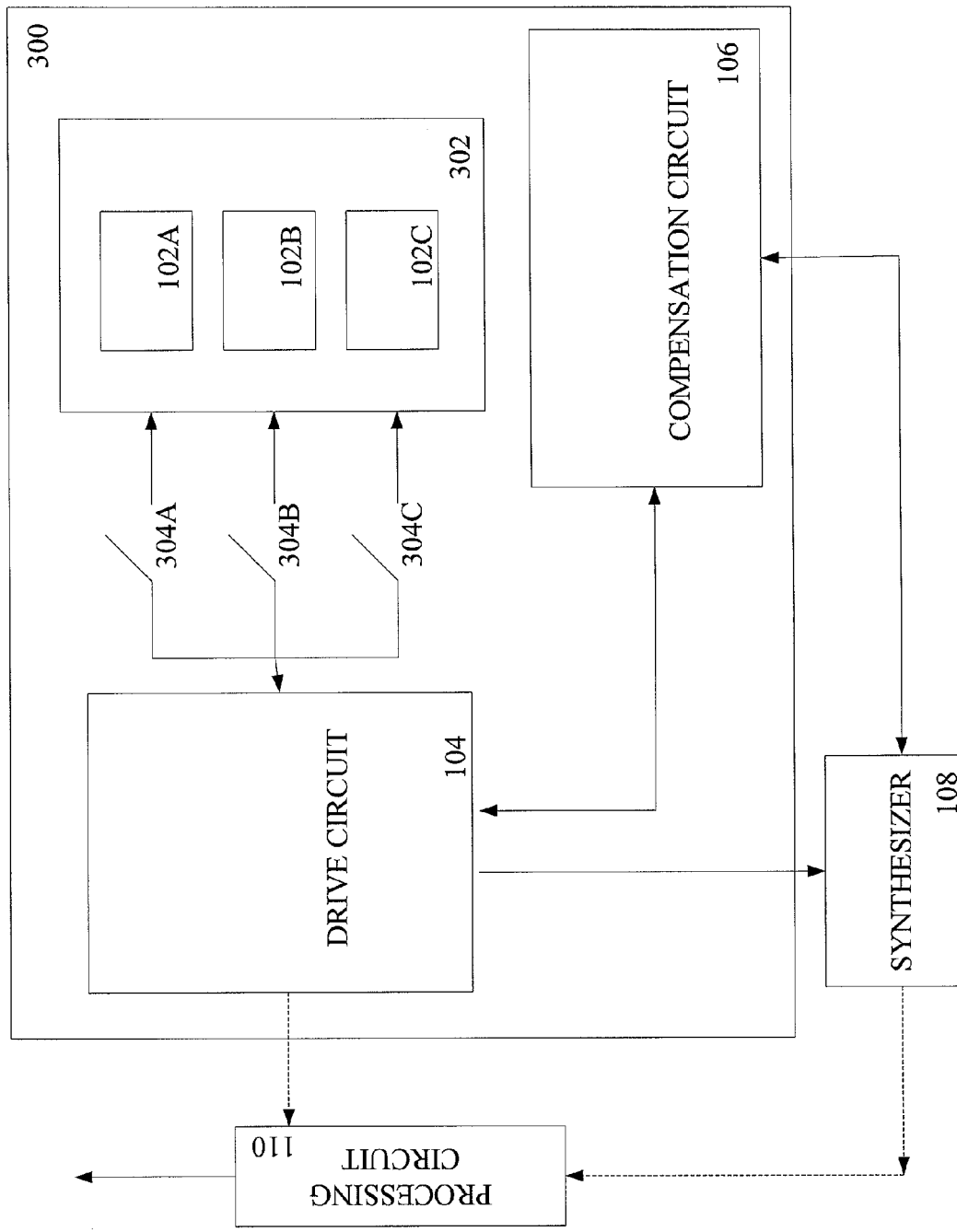
FIG. 3 shows a timing oscillator with a bank of mechanical resonator structures according to an embodiment of the present invention.

FIG. 3 illustrates another embodiment of the invention. In this embodiment, a timing oscillator 300 includes a drive circuit 104, a compensation circuit 106, a bank of mechanical resonators 302 comprising a plurality of mechanical resonators 102A, 102B, and 102C, and associated switches 304A, 304B, and 304C. In general, any number of mechanical resonators may be used in the timing oscillator.

The drive circuit 104 drives the bank of mechanical resonators 302. Resonators 102A, 102B, and 102C can be programmed to generate signals with different frequencies. Thus the bank of mechanical resonators 302 can be used to output a plurality of signals, each signal having a unique phase and frequency. Having a device with multiple frequency outputs can be useful when used in appliances, such as mobile phones, that are programmed for operating at different frequencies. In addition, one can utilize a standard and preprogrammed bank of mechanical resonators to operate in conjunction with a plurality of devices.

In one embodiment of the invention, the drive circuit is connected to switches 304A, 304B, and 304C. The switches 304A, 304B, and 304C can be programmed for specific applications or set by default to select signals with a desired frequency or frequency range. The switches can be mechanical, electrical, or electromechanical. By way of example, a switch could be a transistor. The switches control the selection of outputs from the bank of mechanical resonators 302 for further processing. In general any number of switches may be used for any number of mechanical resonators built into the bank of resonators 302. A mechanical resonator may not be limited to one switch and may be connected to multiple switches. Similarly, a switch may be connected to multiple mechanical resonators. A switch may be used for any purpose and is not limited for purposes of selection in the timing oscillator.

In one embodiment of the invention, a selected timing oscillator output is passed through a filter. In general, filters can be used to limit the spectral band of the timing oscillator's output signal and can further optimize the output signal by removing spurious and/or unwanted components in a signal. Optimization of the output signal using a filter is optional and can be carried out by various components and devices. It should be understood that a filter can be coupled in any configuration with the timing oscillator 300 and may also be integrated into the timing oscillator 300.

In another embodiment of the invention, a dividing circuit is coupled to the output of a timing oscillator. In one aspect of the invention, the dividing circuit receives the signal generated by the timing oscillator as an input. A dividing circuit can be programmed or adjusted by a user to reduce the operating frequency of the generated signal. Reducing the operating frequency of a signal can be conducted by various means including using a mixer. By dividing the frequency of an input signal, the resulting signal will have an improved phase noise. As indicated earlier, reducing a signal's frequency to half its initial frequency can improve the phase noise by a factor of 6 dB. Some methods of the invention involve processing the signal generated by the mechanical resonator to provide a timing oscillator output signal that has a frequency greater than or equal to the generated signal.

An advantage of timing oscillators according to certain embodiments of the invention is that timing oscillators may be used to generate high frequency signals, which, as noted above, may have improved phase noise. The dividing circuit may be built into the timing oscillator or, according to some embodiments of the invention, be part of the processing circuitry 110 coupled to the timing oscillator. A timing oscillator may also be configured to produce an output signal with a frequency that is equal to or less than the frequency of a signal generated by the resonator 102. In a preferred embodiment of the invention, for example, frequencies in the upper MHz range (e.g., greater than 100 MHz) or GHz range (e.g., between 1 GHz and 10 GHz) are generated without the need for a frequency multiplier as is needed for certain conventional timing oscillators. In some cases, the generated signal may have a frequency of at least 1 GHz (e.g., between 1 GHz and 10 GHz) where as the output signal may, for example, have a frequency of at least 100 MHz (e.g., between 100 MHz and 1 GHz). A timing oscillator may also be used to provide an output signal and/or provide a generated signal in the lower MHz or KHz range. In some cases, the output signal and/or generated signal may have a frequency of at least 1 MHz (e.g., 13 MHz, 26 MHz) or, in some cases, at least 32 KHz.

Figure 4B:
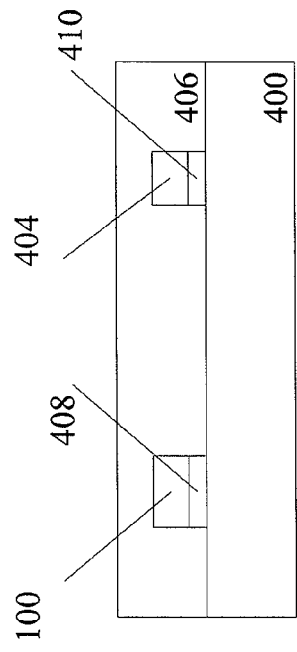
FIGS. 4A-4D show a packaged device of a timing oscillator device according to several embodiments of the present invention.

According to some embodiments of the invention, the timing oscillator can be built on a single substrate. That is, all components of the timing oscillator may be formed on the same substrate. In some cases, additional components may also be formed on the same substrate. For example, as shown in FIG. 4A, the timing oscillator 100 and an additional device 404 are built on a single substrate 402 and surrounded, at least in part, by a package 406 on a single chip module 400 (e.g., circuit board). The timing oscillator 100 could include a drive circuit, a mechanical resonator or a bank of mechanical resonators, and a compensation circuit and the device could be a filter, switch, or any other element needed to achieve a required design objective.

Examples of commonly used substrates for timing oscillators include any suitable semiconductor substrates such as silicon, III-V compounds, and the like.

Package 406 typically surrounds the timing oscillator and device so that they are not exposed to the ambient environment. In general, any suitable packaging material may be used.

Advantageously, the timing oscillators of certain embodiments of the invention may have dimensions which may enable them to be incorporated into a conventional chip package. This is in contrast with certain conventional timing oscillators which have larger dimensions. For example, the timing oscillators according to some embodiments of the invention may have a height of less than 0.8 mm; in some embodiments, less than 0.5 mm; and in some embodiments, less than 0.25 mm.

In another embodiment of the invention, the timing oscillator and an additional device may be implemented on the same chip but with different substrates. As shown in FIG. 4B, timing oscillator 100 is built on a substrate 408 whereas the additional device 404 is built on a different substrate 410. The timing oscillator 100 and additional device 404 can be integrated into a single chip module 400. The choice of substrate for the device will depend on the type device being used. If the timing oscillator comprises a bank of mechanical resonators, each mechanical resonator may be prepared on a different substrate.

In another embodiment of the invention, the components of the timing oscillator can be packaged and manufactured as separate chips and integrated with the timing oscillator into a single multi-chip module. According to this embodiment, as illustrated in FIG. 4C, a timing oscillator 100 can be designed and packaged 406A separately from the additional device (packaged 406B) and planted on a multichip module 412. In this embodiment, the timing oscillator and device can have the same substrate.

Figure 4D:
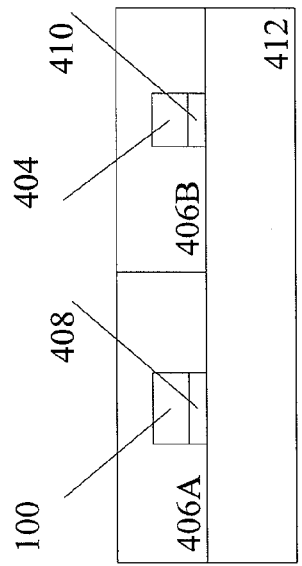
Figure 4A:
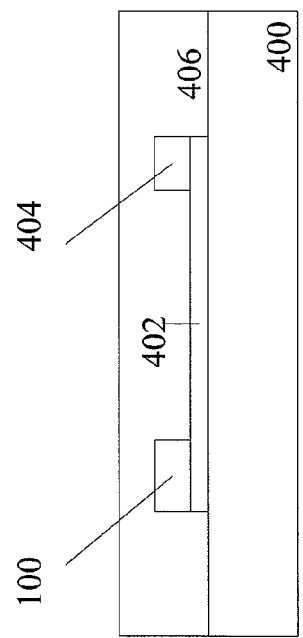
Figure 4C:
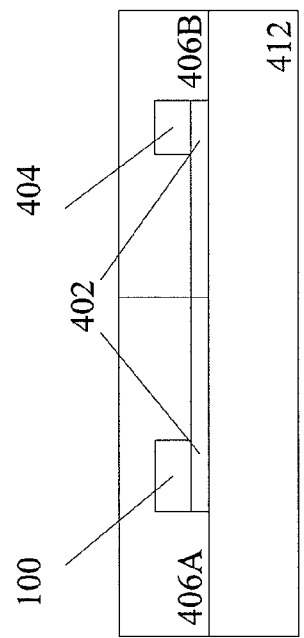

Alternatively as shown in FIG. 4D, in another embodiment of the invention, the timing oscillator 100 and additional device 404 can have different substrates 408 and 410, be packaged separately 406A and 406B and still be integrated into a single multi-chip module 412. As mentioned earlier, the additional device may be any element, such as a filter, switch, electro, or electromechanical device, that helps achieve a design or performance objective.

Figure 5:
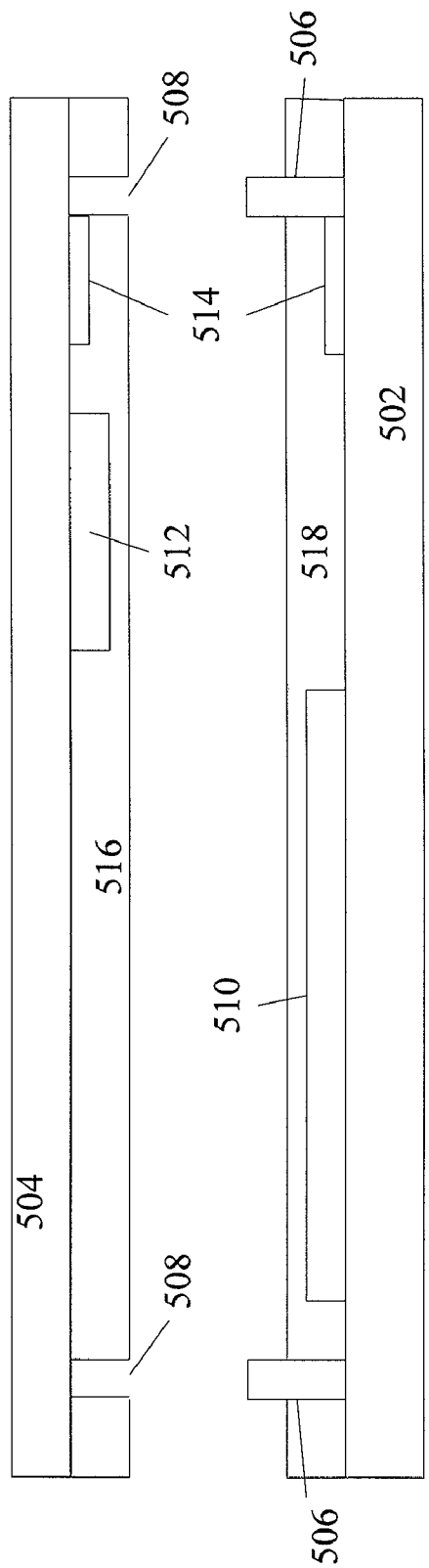
FIG. 5 shows multi-substrate packaging of a timing oscillator according to an embodiment of the present invention.

According to another embodiment of the invention, a timing oscillator can be fabricated on two substrates in a flip-chip orientation as shown in FIG. 5. In these embodiments, one or more components of the timing oscillator may be formed on a first substrate and one or more components are formed on the second substrate. The components on one substrate may be electrically connected to the components on the other substrate, for example, by an electrically conductive pathway that extends between the two substrates.

As shown in FIG. 5, a first substrate 502 has a plurality of bonding sites with bumps 506 that extends upwards. The second substrate 504 also has a plurality of bonding sites but with holes 508 etched onto the second substrate. The second substrate 504 is flipped and corresponding bonding sites 506 and 508 of the first and second substrate are aligned so that the two substrates can be bonded together. Examples of the first substrate 502 and/or second substrate 504 include device and cap wafers which may include silicon, silicon germanium, or other doped and undoped semiconductor materials. Both substrates have packaging layers 516 and 518 implanted using packaging methods well known to one of skill in the art.

In one embodiment of the invention, the mechanical resonator or a bank of mechanical resonators 510 may be situated on the first substrate 502. Additional circuitry 512 may be situated on the second substrate. Examples of additional circuitry 512 include and are not limited to compensation circuits, PLLs, filters, or any electronic components or devices that may be physically and functionally implemented on the second substrate 504. The mechanical resonator 510 may be electrically coupled to the additional circuitry 512 using interconnects 514 or the bonding sites 506 and 508. According to one embodiment of the invention, the coupling may be achieved using vias filled with conductive material. In general, a via may be considered an element that allows interconnection between multiple interconnect layers of a device.

Having thus described several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A timing oscillator designed to produce an output signal, the timing oscillator comprising:
    at least one mechanical resonating structure, the at least one mechanical resonating structure configured to produce a resonator signal;
    at least one drive circuit coupled to the at least one mechanical resonating structure and configured to drive the at least one mechanical resonating structure to produce the resonator signal, wherein the at least one drive circuit has a feedback loop including a tunable resistive component and a tunable capacitive component; and
    a compensation circuit configured to compensate an operating frequency of the timing oscillator,
    wherein a total height of the timing oscillator is less than 0.5 mm.

2. The timing oscillator of claim 1, further comprising a filter configured to filter the resonator signal.

3. The timing oscillator of claim 1, wherein the at least one mechanical resonating structure is formed on a first substrate and wherein the at least one drive circuit is formed on a second substrate.

4. The timing oscillator of claim 3, wherein the second substrate is coupled to the first substrate at a bonding site in a flipped orientation.

5. The timing oscillator of claim 3, wherein the second substrate is coupled to the first substrate using interconnects.

6. The timing oscillator of claim 3, wherein the first substrate is silicon and the second substrate is silicon.

7. The timing oscillator of claim 3, wherein the first substrate is a device wafer and the second substrate is a cap wafer.

8. The timing oscillator of claim 3, wherein the first substrate and the second substrate are arranged in parallel relation to each other.

9. The timing oscillator of claim 1, wherein the compensation circuit contains a calibration table storing information relating to the operational frequency of the at least one mechanical resonating structure as a function of temperature.

10. The timing oscillator of claim 1, wherein the feedback loop of the at least one drive circuit comprises an operational amplifier.

11. The timing oscillator of claim 2, wherein the feedback loop of the at least one drive circuit comprises an operational amplifier.

12. The timing oscillator of claim 4, wherein the feedback loop of the at least one drive circuit comprises an operational amplifier.

13. The timing oscillator of claim 5, wherein the feedback loop of the at least one drive circuit comprises an operational amplifier.

14. The timing oscillator of claim 6, wherein the feedback loop of the at least one drive circuit comprises an operational amplifier.

15. The timing oscillator of claim 7, wherein the feedback loop of the at least one drive circuit comprises an operational amplifier.

16. The timing oscillator of claim 8, wherein the feedback loop of the at least one drive circuit comprises an operational amplifier.

17. The timing oscillator of claim 3, wherein the feedback loop of the at least one drive circuit comprises an operational amplifier.

18. The timing oscillator of claim 9, wherein the feedback loop of the at least one drive circuit comprises an operational amplifier.

* * * * *